(12) United States Patent
Duclos et al.

(10) Patent No.: US 6,593,600 B1
(45) Date of Patent: *Jul. 15, 2003

(54) RESPONSIVE BIDIRECTIONAL STATIC SWITCH

(75) Inventors: Franck Duclos, Tours (FR); Jean-Michel Simonnet, Veretz (FR); Olivier Ladiray, Montlouis sur Loire (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

This patent is subject to a terminal disclaimer.

(21) Appl. No.: 09/634,076

(22) Filed: Aug. 8, 2000

(30) Foreign Application Priority Data

Aug. 9, 1999 (FR) .......................................... 99 10412

(51) Int. Cl.[7] ........................ H01L 29/74; H01L 31/111
(52) U.S. Cl. ..................... 257/107; 257/119; 257/121; 257/123; 257/130; 257/146; 257/157; 257/159; 257/175
(58) Field of Search ............................... 257/107, 110, 257/119, 121, 123, 126, 127, 128, 130, 146, 157, 159, 175

(56) References Cited

U.S. PATENT DOCUMENTS

| 4,157,562 A | 6/1979 | D'Altroy et al. ............. 357/39 |
| 6,034,381 A | * 3/2000 | Pezzani ....................... 257/107 |
| 6,380,565 B1 | * 4/2002 | Duclos et al. ............... 257/123 |

FOREIGN PATENT DOCUMENTS

| EP | A-0 817 277 | 1/1998 | ................. 257/101 |

OTHER PUBLICATIONS

French Search Report from French patent application 99 10412, filed Aug. 9, 2000.

* cited by examiner

*Primary Examiner*—Steven Loke
(74) *Attorney, Agent, or Firm*—Wolf, Greenfield & Sacks, P.C.; James H. Morris

(57) ABSTRACT

A monolithic bidirectional switch formed in a semiconductor substrate of type N, including a first main vertical thyristor, the rear surface layer of which is of type P, a second main vertical thyristor, the rear surface layer of which is of type N, an auxiliary vertical thyristor, the rear surface layer of which is of type P and is common with that of the first main thyristor, a peripheral region of type P especially connecting the rear surface layer of the auxiliary thyristor to the layer of this thyristor located on the other side of the substrate, a first metallization on the rear surface side, a second metallization on the front surface side connecting the front surface layers of the first and second thyristors. An additional region has a function of isolating the rear surface of the auxiliary thyristor and the first metallization.

9 Claims, 2 Drawing Sheets

RESPONSIVE BIDIRECTIONAL STATIC SWITCH

BACKGROUND OF THE INVENTION

1. Field of the Invention

The present invention relates to making, in monolithic form, bidirectional switches of medium power.

2. Discussion of the Related Art

The most current static bidirectional switches are triacs. A triac corresponds to the antiparallel association of two thyristors. It can thus be directly connected in an A.C. network, for example, the mains. The gate of a conventional triac corresponds to the cathode gate of one at least of the two thyristors forming it and is referenced to the electrode located on the front surface of this triac, that is, the surface that includes the gate terminal, while the other triac surface is typically connected to a heat sink and to the ground.

Bidirectional switches of the type described in European patent application No. 0817277, the triggering of which is ensured by applying a voltage between a control electrode located on the front surface of the component and a main electrode located on the opposite surface of the component, will more specifically be considered hereafter.

FIG. 1 shows an equivalent electric diagram of such a bidirectional switch. A control electrode G of the bidirectional switch is connected to the emitter of a bipolar transistor T, the collector of which is connected the anode gates of first and second thyristors Th1 and Th2 placed in antiparallel between two terminals A1 and A2. Terminal A1 corresponds to the anode of thyristor Th1 and to the cathode of thyristor Th2. Terminal A1 is also connected to the base of transistor T. Terminal A2 corresponds to the anode of thyristor Th2 and to the cathode of thyristor Th1.

FIG. 2 is a simplified cross-section view of an example of monolithic embodiment of the bidirectional switch described in relation with FIG. 1. Transistor T is formed in the left-hand portion of the drawing, thyristor Th1 at the center, and thyristor Th2 to the right thereof.

The structure of FIG. 2 is formed from an N-type lightly-doped semiconductor substrate 1. The anode of thyristor Th1 corresponds to a P-type layer 2 that is formed on the rear surface side of substrate 1. Its cathode corresponds to an N-type region 3 formed on the front surface side in a P-type well 4. The anode of thyristor Th2 corresponds to a P-type well 5 formed on the front surface side and its cathode corresponds to an N-type region 6 formed on the rear surface side in layer 2. The periphery of the structure is formed of a heavily-doped P-type layer 7 extending from the front surface to P-type layer 2. Conventionally, region 7 is obtained by drive-in from the two substrate surfaces. The rear surface is coated with a metallization M1 corresponding to first terminal A1 of the bidirectional switch. The upper surfaces of regions 3 and 5 are coated with a second metallization M2 corresponding to second terminal A2 of the bidirectional switch. An N-type region 8 is formed, on the front surface side, in a P-type well 9 in contact with peripheral region 7. The surface of region 8 is contacted by a metallization M3 connected to control terminal G of the bidirectional switch. A metallization M4 may be formed on the upper surface of peripheral region 7. Metallization M4 is not connected to an external terminal. As an alternative, well 9 may be separated from peripheral region 7 and electrically connected thereto via metallization M4.

The operation of this bidirectional switch is the following.

When terminal A2 is negative with respect to terminal A1, thyristor Th1 is likely to be on. If a sufficiently negative voltage with respect to metallization M1 is applied to gate G, the base-emitter junction of transistor T is forward biased and this transistor turns on. A vertical current $i_c$ shown in dotted lines in FIG. 2 thus flows from metallization M1, through the forward junction between layer 2 and substrate 1, then into regions 1, 9 and 8 corresponding to transistor T. Carriers are thus generated at the level of the junction between substrate 1 and well 9 near the junction between substrate 1 and well 4, and thyristor Th1 is turned on. It can also be considered that an auxiliary vertical NPNP thyristor including regions 8-9-1-2, region 9 of which forms the cathode gate region, has been triggered.

Similarly, when terminal A2 is positive with respect to terminal A1, applying a negative voltage on terminal G turns transistor T on. The carriers present in the vicinity of the junction between substrate 1 and layer 2 turn thyristor Th2 on, as will be better understood by referring to the simplified top view of FIG. 4 in which it can be seen that the region corresponding to transistor T is a neighbor to a portion of each of thyristors Th1 and Th2.

Practice reveals that this type of bidirectional switch has a non-optimal control responsiveness, that is, especially, that the current required to trigger thyristor Th1 is of several hundreds of milliamperes.

SUMMARY OF THE INVENTION

An object of the present invention is to provide a novel embodiment in monolithic form of a bidirectional switch of the above mentioned type that exhibits a greater control responsiveness of thyristor Th1.

To achieve this and other objects, the present invention provides a monolithic bidirectional switch formed in a semiconductor substrate of a first conductivity type having a front surface and a rear surface, including a first main vertical thyristor, the rear surface layer of which is of the second conductivity type, a second main vertical thyristor, the rear surface layer of which is of the first conductivity type, an auxiliary vertical thyristor, the rear surface layer of which is of the second conductivity type and is common with the rear surface layer of the first main thyristor, a peripheral region of the second conductivity type especially connecting the rear surface layer of the auxiliary thyristor to the layer of this thyristor located on the other side of the substrate, a first metallization on the rear surface side, a second metallization on the front surface side connecting the front surface layers of the first and second thyristors. An additional region isolates the rear surface of the auxiliary thyristor and the first metallization.

According to an embodiment of the present invention, the additional region is made of a semiconductor material of the first conductivity type.

According to an embodiment of the present invention, the thickness of the additional region is smaller than that of the rear surface region of the second main vertical thyristor.

According to an embodiment of the present invention, the additional region is made of silicon oxide.

The foregoing objects, features and advantages of the present invention, will be discussed in detail in the following non-limiting description of specific embodiments in connection with the accompanying drawings.

DETAILED DESCRIPTION

For clarity, the same elements have been designated by same references in the different drawings. Further, as usual in the representation of integrated circuits, FIGS. 2, 3, and 4 are not drawn to scale.

Figure 2:
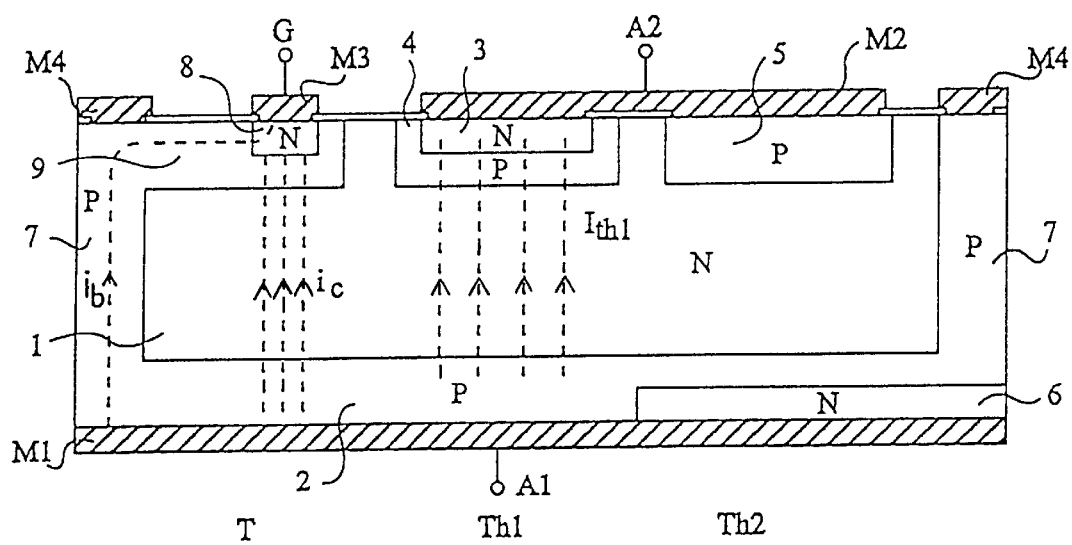
FIG. 2 is a simplified cross-section view of a conventional embodiment of the bidirectional switch of FIG. 1.
Figure 3:
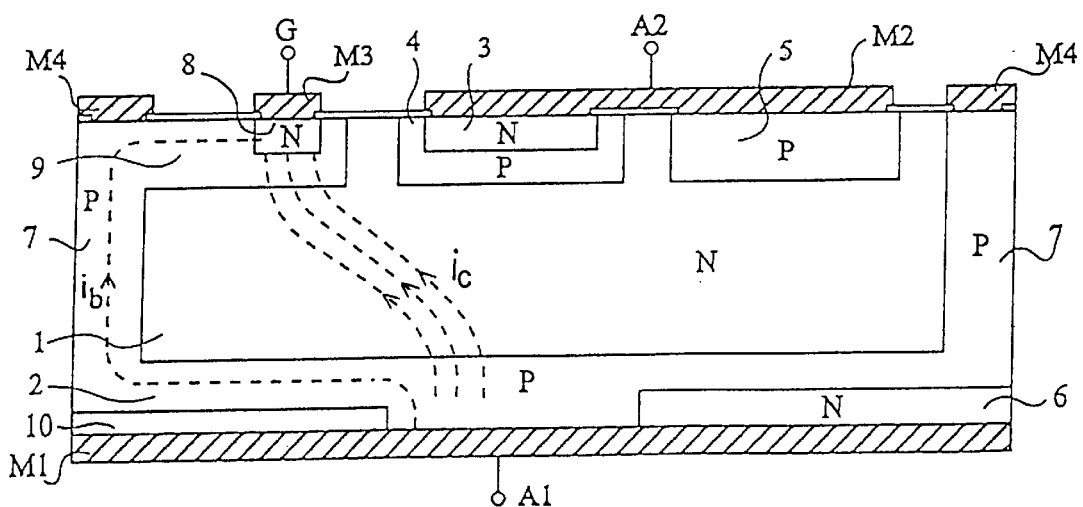
FIG. 3 shows a simplified cross-section view of an embodiment according to the present invention of the bidirectional switch of FIG. 1.
Figure 4:
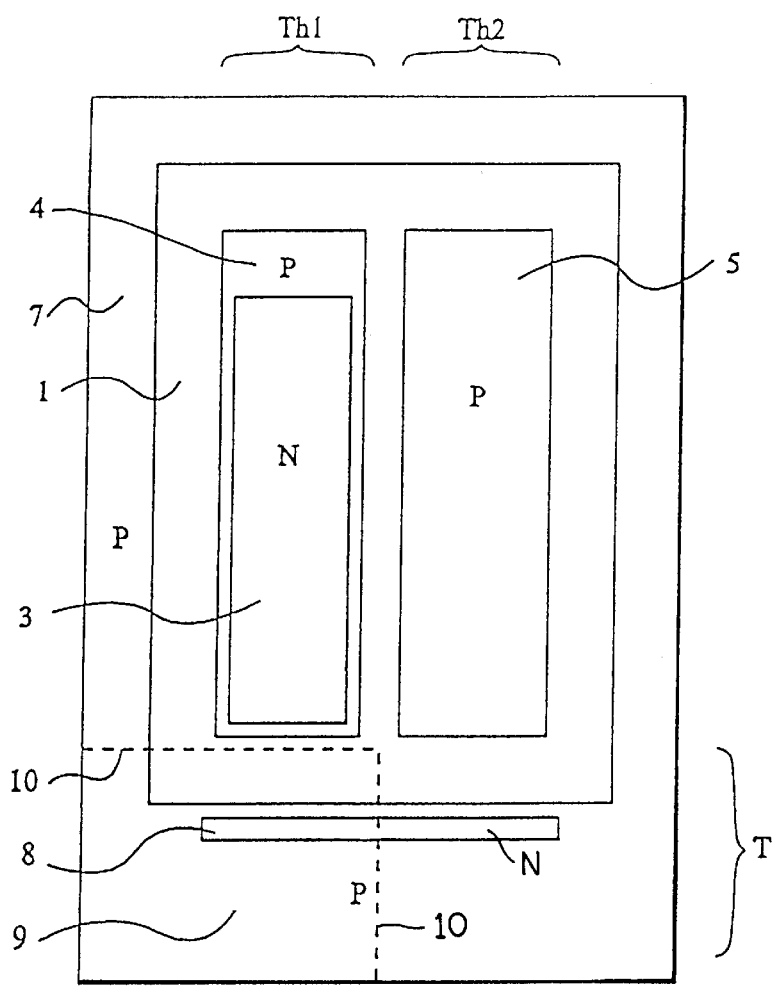
FIG. 4 shows an example of a top view of the bidirectional switch of FIG. 3.

FIG. 3 is a simplified cross-section view of an embodiment of a monolithic bidirectional switch according to the present invention. The structure of the various areas formed in semiconductor substrate 1 is identical to that illustrated in FIG. 2. The difference between the two drawings is that a region 10 having an isolation function, substantially under the above-mentioned auxiliary vertical thyristor, is provided on the rear surface side, between layer 2 and metallization M1. This also appears from FIG. 4 in which the contour of region 10 is designated by a dotted line on the bottom left-hand portion of the drawing. Layer 6, not shown in FIG. 4, occupies the entire lower surface except for the area located under P-type well 4 and the surface occupied by region 10.

According to an embodiment of the present invention, region 10 is formed of a semiconductor N-type doped material.

The operation of the bidirectional switch remains substantially similar to what has been described in relation with FIG. 2. However, base current $i_b$ of transistor T, running from metallization M1 to region 8, is now changed by the presence of region 10, and flows according to path $i_b$ of FIG. 3.

The main current of the auxiliary vertical thyristor is also changed, as shown by arrows $i_c$. It can be seen that by modifying the dimensions of region 10, the passing of current $i_c$ is favored in the vicinity of the areas where it is most efficient to turn on thyristor Th1, that is, close to the limit of well 4.

Tests performed by the applicants have shown that the triggering current of thyristor Th1 is reduced or minimized when region 10 extends to face P-type well 4 in which N-type region 3 forming the cathode of thyristor Th1 is formed.

According to the present invention, the thickness of region 10 must be sufficiently small to initially enable the starting of transistor T by the conduction of current $i_b$ from layer 2 to region 8 via peripheral region 7. Indeed, if region 10 is too thick, the remaining thickness of layer 2 between region 10 and substrate 1 results in the existence of too high a resistance that opposes to the flowing of base current $i_b$.

In practice, the thickness of region 10 will be smaller than that of layer 6. Indeed, layer 6 forms the cathode of thyristor Th2 and its thickness is determined by the characteristics, especially relating to the triggering current, of this sole thyristor. The thickness of layer 6 will for example be on the order of 10 to 15 μm, while the thickness of region 10 will be as small as possible.

According to an alternative embodiment of the present invention, region 10 is made of an insulating material, preferably silicon oxide ($SiO_2$).

Figure 1:
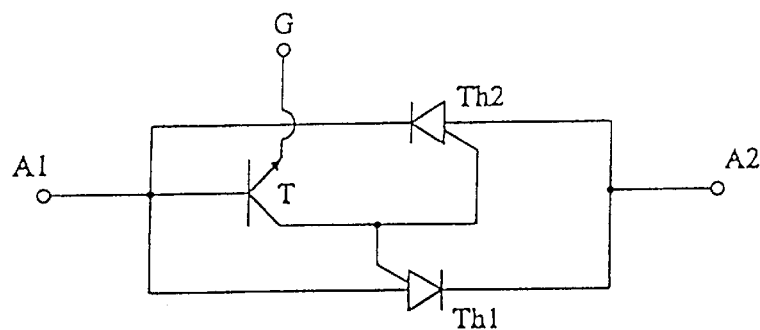
FIG. 1 is a schematic electric diagram of a conventional bidirectional switch.

Of course, the present invention is likely to have various alterations, modifications, and improvements which will readily occur to those skilled in the art. In particular, the present invention applies to any type of monolithic realization of the bidirectional switch structure or of a network of bidirectional switches similar to that shown in FIG. 1. Further, all conductivity types could be inverted, with the biasings being then correspondingly modified.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A bidirectional switch formed in a semiconductor substrate, the switch comprising:

a transistor having at least one current path within the substrate; a first thyristor and a second thyristor each having a gate function within the substrate;

means for diverting said at least one current path of the transistor to add to a carrier concentration proximate the gate junction of the first thyristor.

2. A bidirectional switch formed in a semiconductor substrate, the switch comprising:

a first thyristor and a second thyristor connected is antiparallel and each having a gate junction within the substrate;

a transistor having at least one conducting current within the substrate, a contributing portion proximate the gate junction of the first thyristor providing a trigger current to the first thyristors;

means for reducing the at least one conducting current necessary to trigger the first thyristor by diverting the at least one conducting current such that additional current is added to the contributing portion.

3. A monolithic bidirectional switch formed in a semiconductor substrate of a first conductivity type having a front surface and a rear surface, including:

a first main vertical thyristor, a rear surface layer of which is of a second conductivity type, a second main vertical thyristor, a rear surface layer of which is of the first conductivity type, an auxiliary vertical thyristor, a rear surface layer of which is of the second conductivity type and is common with the rear surface layer of the first main thyristor, a peripheral region of the second conductivity type connecting the rear surface layer of the auxiliary thyristor to a layer of the auxiliary thyristor located on the other side of the substrate, a first metallization on the rear surface side, a second metallization on the front surface side connecting front surface layers of the first and second thyristors, and an additional region that isolates a portion of the rear surface of the auxiliary thyristor and the first metallization.

4. The bidirectional switch of claim 1, wherein the additional region is made of a semiconductor material of the first conductivity type.

5. The bidirectional switch of claim 2, wherein the thickness of the additional region is smaller than that of the rear surface layer of the second main vertical thyristor.

6. The bidirectional switch of claim 1, wherein the additional region is made of silicon oxide.

7. A monolithic bidirectional switch formed in a semiconductor substrate of a first conductivity type having a front surface and a rear surface, including:

a first thyristor including a rear surface layer of a second conductivity type, a second thyristor including a rear surface layer of the first conductivity type, a switch including a rear surface layer of the second conductivity type common with the rear surface layer of the first thyristor, a peripheral region of the second conductivity type connecting the rear surface layer of the switch to a layer of the switch located on the other side of the substrate, a first metallization on the rear surface side, a second metallization on the front surface side connecting front surface layers of the first and second thyristors, and an additional region that isolates a portion of the rear surface of the switch and the first metallization.

8. In a bi-directional switch formed in a semiconductor substrate including a transistor and a first thyristor and a second thyristor connected in anti-parallel, a collector region of the transitor and gate junctions of the thryistor being turned within the substrate, a method of reducing a switch current necessary to trigger the first thyristor, the method including an act of:

diverting at least one current path of the transistor to add to a carrier concentration proximate the gate junction of the fist thyristor.

9. In a bi-directional switch formed in a semiconductor substrate including a transistor and a first thyristor and a second thyristor connected in anti-parallel, a collector region of the transistor and gate junctions of the thyristors being turned within the substrate, a method of improving the control responsiveness of the switch, the method including acts of:

forming the transistor proximate the thyristors such that a portion of at least one conducting current of the transistor contributes to triggering the thyristors;

diverting the at least one conducting current such that additional carriers proximate the gate junction of the first thyristor contributing to triggering the first thyristor.

* * * * *

UNITED STATES PATENT AND TRADEMARK OFFICE
CERTIFICATE OF CORRECTION

PATENT NO. : 6,593,600 B1  
DATED : July 15, 2003  
INVENTOR(S) : Franck Duclos, Jean-Micheal Simonnet and Olivier Ladiray It is certified that error appears in the above-identified patent and that said Letters Patent is hereby corrected as shown below:

Column 4,  
Line 19, "function" should read -- junction --  
Line 26, "is" should read -- in --

Column 6,  
Line 7, "fist" should read -- first --  
Line 12, delete "turned" and insert -- formed -- in its place.

Signed and Sealed this

Ninth Day of December, 2003

JAMES E. ROGAN  
*Director of the United States Patent and Trademark Office*

UNITED STATES PATENT AND TRADEMARK OFFICE
CERTIFICATE OF CORRECTION

PATENT NO. : 6,593,600 B1
DATED : July 15, 2003
INVENTOR(S) : Franck Duclos, Jean-Michel Simonnet and Olivier Ladiray It is certified that error appears in the above-identified patent and that said Letters Patent is hereby corrected as shown below:

<u>Column 6,</u>
Line 1, "thryistor" should read -- thyristors --.
Line 2, "turned" should read -- formed --.

Signed and Sealed this

Thirteenth Day of April, 2004

JON W. DUDAS
*Acting Director of the United States Patent and Trademark Office*